(12) United States Patent
Paquin et al.

(10) Patent No.: US 8,526,177 B2
(45) Date of Patent: Sep. 3, 2013

(54) FAN FOR COOLING MULTIPLE PROCESSORS HOUSED IN A SUB-CHASSIS

(75) Inventors: David M. Paquin, Cypress, TX (US);
John D. Nguyen, Cypress, TX (US);
Michael L. Sabotta, Houston, TX (US);
Larry E. Wilson, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 227 days.

(21) Appl. No.: 12/773,629

(22) Filed: May 4, 2010

(65) Prior Publication Data
US 2011/0273841 A1 Nov. 10, 2011

(51) Int. Cl.
*H05K 7/20* (2006.01)
*H05K 5/00* (2006.01)

(52) U.S. Cl.
USPC ............... 361/679.49; 361/695; 361/679.46; 454/184

(58) Field of Classification Search
USPC ............... 361/679.46, 679.48–679.51, 695, 361/724–727; 165/80.2–80.3; 454/184
See application file for complete search history.

(56) References Cited

U.S. PATENT DOCUMENTS

| | | | | | |
|---|---|---|---|---|---|
| 5,337,464 | A | * | 8/1994 | Steffes | 29/401.1 |
| 5,338,214 | A | * | 8/1994 | Steffes et al. | 439/160 |
| 5,513,329 | A | * | 4/1996 | Pecone | 710/301 |
| 6,330,156 | B1 | * | 12/2001 | Cresse | 361/695 |
| 6,618,260 | B2 | * | 9/2003 | Willis et al. | 361/752 |
| 6,657,867 | B2 | * | 12/2003 | Smith | 361/725 |
| 6,772,246 | B2 | * | 8/2004 | Kim et al. | 710/62 |
| 6,958,916 | B2 | * | 10/2005 | Roesner et al. | 361/790 |
| 7,499,285 | B2 | * | 3/2009 | Chen et al. | 361/752 |
| 7,623,343 | B2 | * | 11/2009 | Chen | 361/679.32 |
| 2002/0134531 | A1 | * | 9/2002 | Yanagida | 165/80.3 |
| 2009/0040717 | A1 | * | 2/2009 | Liu | 361/695 |

OTHER PUBLICATIONS

Super Micro Computer, Inc., "Shattering the IU Server Performance Record," 8 p.
Super Micro Computer, Inc., "Supermicro GPU-Optimized Supercomputing Server Solutions," Copyright 2010 Super Micro Computer, Inc., 10 p. [Online] http://www.supermicro.com/gpu.

* cited by examiner

*Primary Examiner* — Zachary M Pape (57) ABSTRACT

A chassis comprises a printed circuit board (PCB) and a sub-chassis housing multiple processors that couple to the PCB. The sub-chassis is disposed above and parallel to the PCB. The multiple processors are cooled by a fan disposed on the sub-chassis.

14 Claims, 10 Drawing Sheets

FAN FOR COOLING MULTIPLE PROCESSORS HOUSED IN A SUB-CHASSIS

BACKGROUND

Processors are energy intensive and generate substantial amounts of heat. Although it is often efficient and, thus, desirable to incorporate multiple processors into a small space, the heat generated by the processors is problematic.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

Generally, when multiple articles are described herein as being "parallel" to each other, the articles lie along planes that are consistently equidistant from each other. This definition of the term "parallel" is not a strict one, however, and articles that lie along planes that are not consistently equidistant from each other may still be described as "parallel." For instance and without limitation, articles that lie along planes that intersect at an angle of five or fewer degrees may still reasonably be described as "parallel."

The terms "above" and "below" are used herein to describe relative positions of components within a system. It is contemplated that when a first component in a system chassis is described as being "above" a second component in the system chassis, the chassis could be physically re-oriented so that the second component is "above" the first component. Thus, to avoid this possible ambiguity, the terms "above" and "below" are used with the assumption that any chassis containing components to which the terms refer is physically oriented in a manner that one of ordinary skill in the art would describe as "upright." At least some of the figures herein are described using the terms "above," "below," "in front of" and "behind" to illustrate their precise meanings. The terms "superior," "inferior," "anterior" and "posterior" should be similarly treated.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a system chassis that houses multiple processors within a small space. Although the processors generate substantial amounts of heat, the processors' physical configuration within the system chassis enables proper ventilation of the processors and, thus, proper operation of the processors. Various embodiments of the system chassis and the contents thereof are now described with respect to the figures.

Figure 1:
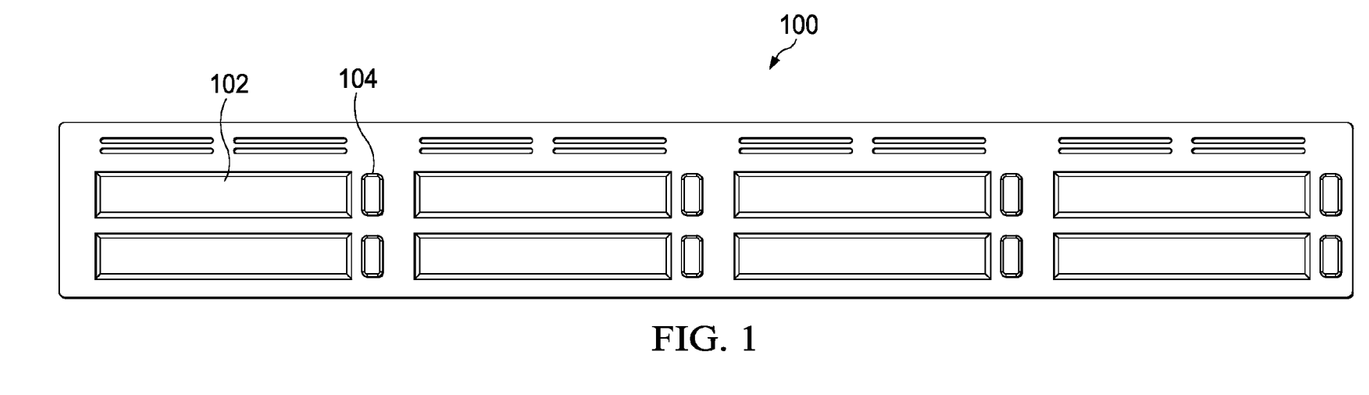
FIG. 1 shows a front-end view of a system, in accordance with embodiments.

FIG. 1 shows a front-end view of a system chassis 100 that is in accordance with embodiments. The system chassis 100 may comprise any type of computer, such as a server (e.g., a 2U server). In some embodiments, the system chassis 100 comprises a server that is capable of being mounted on a server rack. The system chassis 100 comprises multiple hard drive bays 102. Each hard drive bay 102 is capable of housing a removable hard drive. Each hard drive bay 102 couples to a separate eject button 104 which, when pushed, enables a hard drive housed within an associated hard drive bay 102 to be ejected from that hard drive bay 102.

Figure 2:
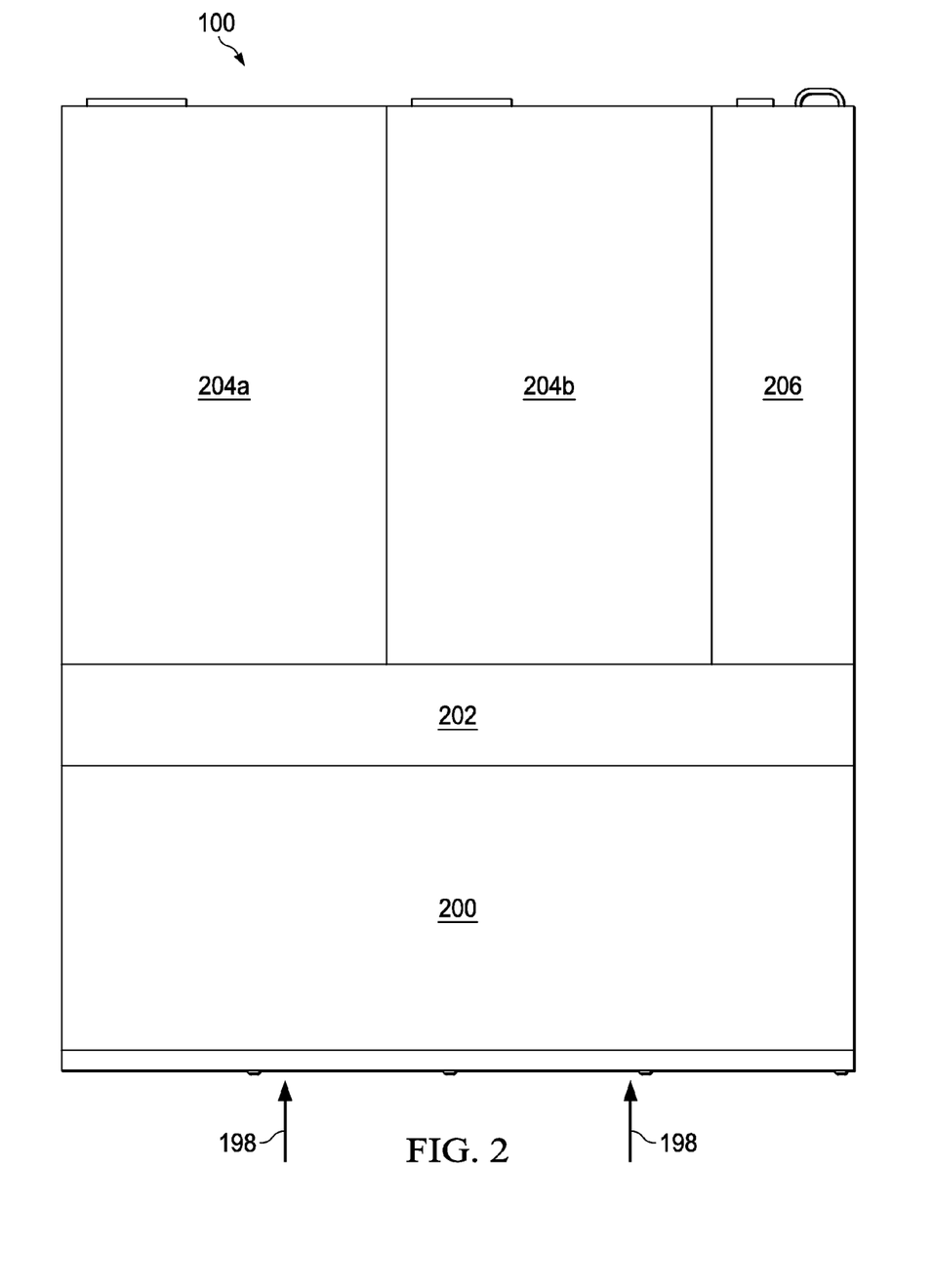
FIG. 2 shows a conceptual, top-down view of the system of FIG. 1 that describes how space within the system is allocated, in accordance with embodiments.

FIG. 2 shows a conceptual, top-down view of the system chassis 100 that describes how space within the system chassis 100 is allocated, in accordance with embodiments. Arrows 198 indicate the front end of the system chassis 100 that is illustrated in FIG. 1. Hard drives inserted into the hard drive bays 102 are housed within a removable hard drive area 200. The removable hard drive area 200 is merely illustrative of some embodiments. In other embodiments, different components may be housed within the system chassis 100 in lieu of the removable hard drive area 200. Chassis fans area 202 comprises multiple (e.g., four) fans that are usable to ventilate various parts of the system chassis 100. The system chassis 100 further comprises nodes 204a and 204b that are disposed posterior to (or "behind") the chassis fans area 202. Nodes 204a and 204b comprise discrete functional units that are removable from the system chassis 100. More specifically, each of the nodes 204a and 204b comprises circuitry (e.g., central processing units, graphics processors, memory, cooling apparatuses like heat sinks and fans, etc.) that enable that node to perform one or more of a variety of functions. The system chassis 100 still further comprises a miscellaneous area 206 that houses miscellaneous electronics (e.g., power supplies to power fans in the chassis fans area 202). Fans in the chassis fans area 202 ventilate circuitry housed within the nodes 204a and 204b and in the miscellaneous area 206. The arrangement of components within the system chassis 100 is not strictly limited to that shown in FIG. 2. The scope of this disclosure includes variations to the arrangement of FIG. 2.

Figure 3:
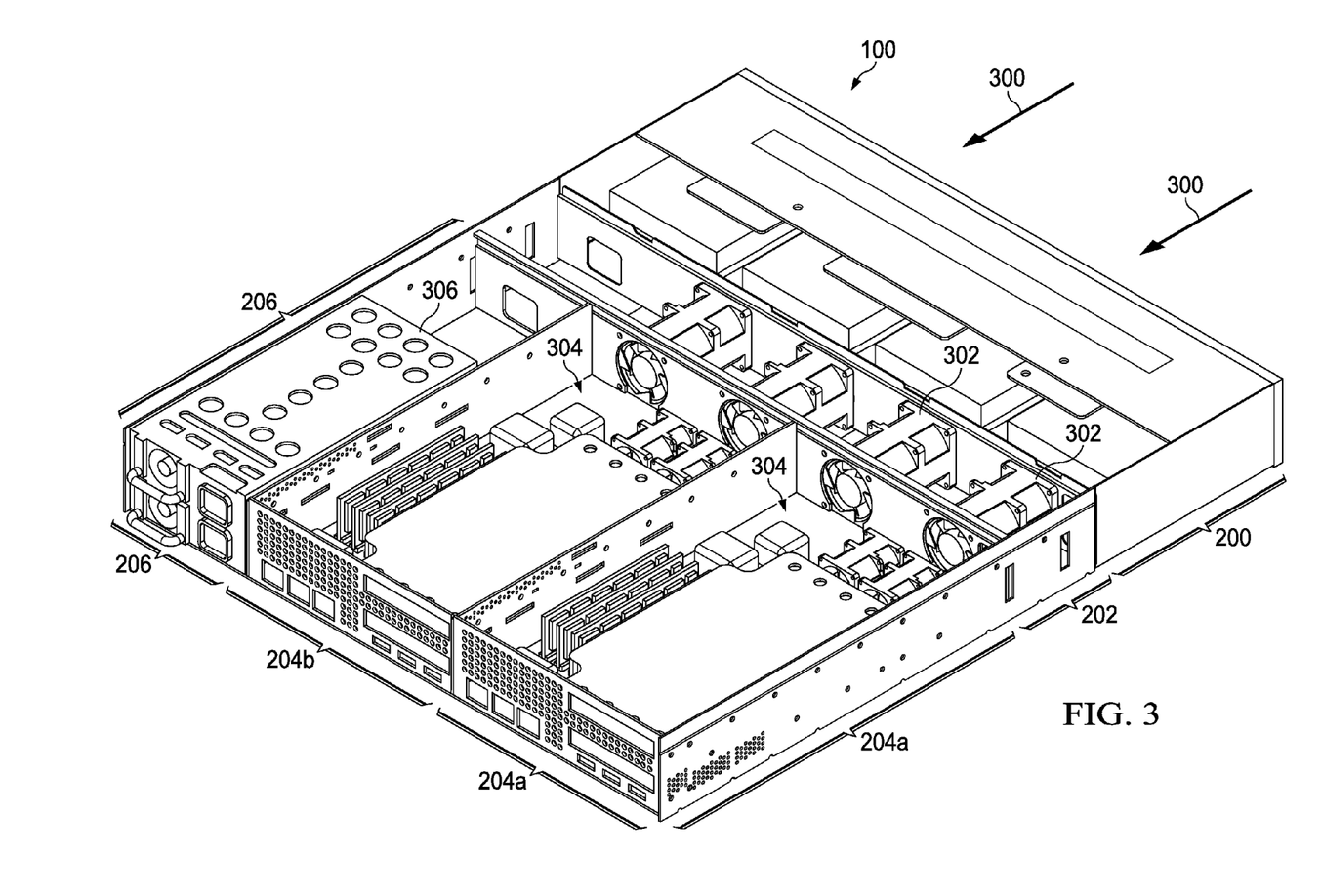
FIG. 3 shows a perspective view of the system of FIGS. 1 and 2, in accordance with embodiments.

FIG. 3 shows a view more detailed than that shown in FIG. 2, in accordance with embodiments. Specifically, FIG. 3 shows a perspective view of the system chassis 100 and, in addition, shows the various components housed within the system chassis 100 in greater detail. Arrows 300 indicate the front-end of the system chassis 100, which is illustrated in FIG. 1. Hard drive bay area 200, chassis fans area 202, node 204a, node 204b and miscellaneous area 206 all are shown in FIG. 3. The chassis fans area 202 comprises multiple chassis fans 302. Nodes 204a and 204b comprise various circuitry 304 and miscellaneous area 206 comprises miscellaneous electronics 306. The circuitry 304 in node 204a may differ from the circuitry 304 in node 204b. The content of the system chassis 100 and, more generally, the scope of this disclosure are not limited to the precise types of circuitry illustrated in FIG. 3. FIG. 3 is illustrative of some embodiments.

Figure 4:
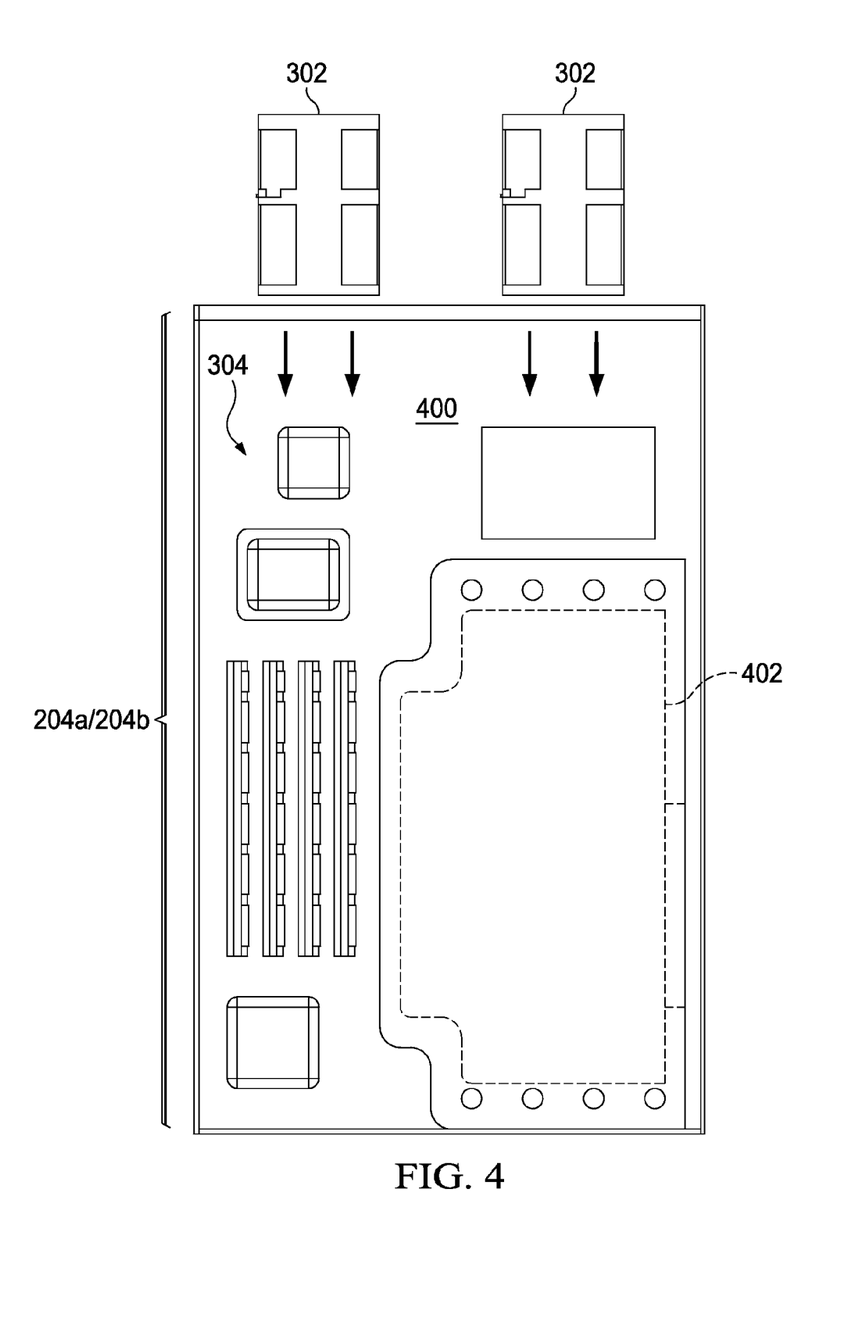
FIG. 4 shows a conceptual illustration of the contents of a node capable of being housed within the system of FIGS. 1-3, in accordance with embodiments.

FIG. 4 shows a conceptual illustration of the contents of a node 204a or 204b. The node 204a/204b comprises a main board 400 (also known as a "printed circuit board") on which various circuitry 304 is disposed. The node 204a/204b further comprises an elevated graphics sub-chassis 402. As shown, the elevated graphics sub-chassis 402 is positioned above (or "superior" to) the main board 400 such that additional circuitry 304 may be disposed on the portion of the main board 400 that is below (or "inferior" to) the elevated graphics sub-chassis 402. The circuitry 304 on the main board 400 may include any suitable type of electronics or other material (e.g., processors, memory, heat sinks, etc.). At least some of the circuitry 304 and at least some of the contents of the elevated graphics sub-chassis 402 (described in greater detail below) are cooled by the chassis fans 302. In some embodiments, the chassis fans 302 have heights that are the same as or within five (5) centimeters of the height of the system chassis 100. In some embodiments, at least some of the chassis fans 302 are positioned so that they pass air directly to the elevated graphics sub-chassis 402.

Figure 5A:
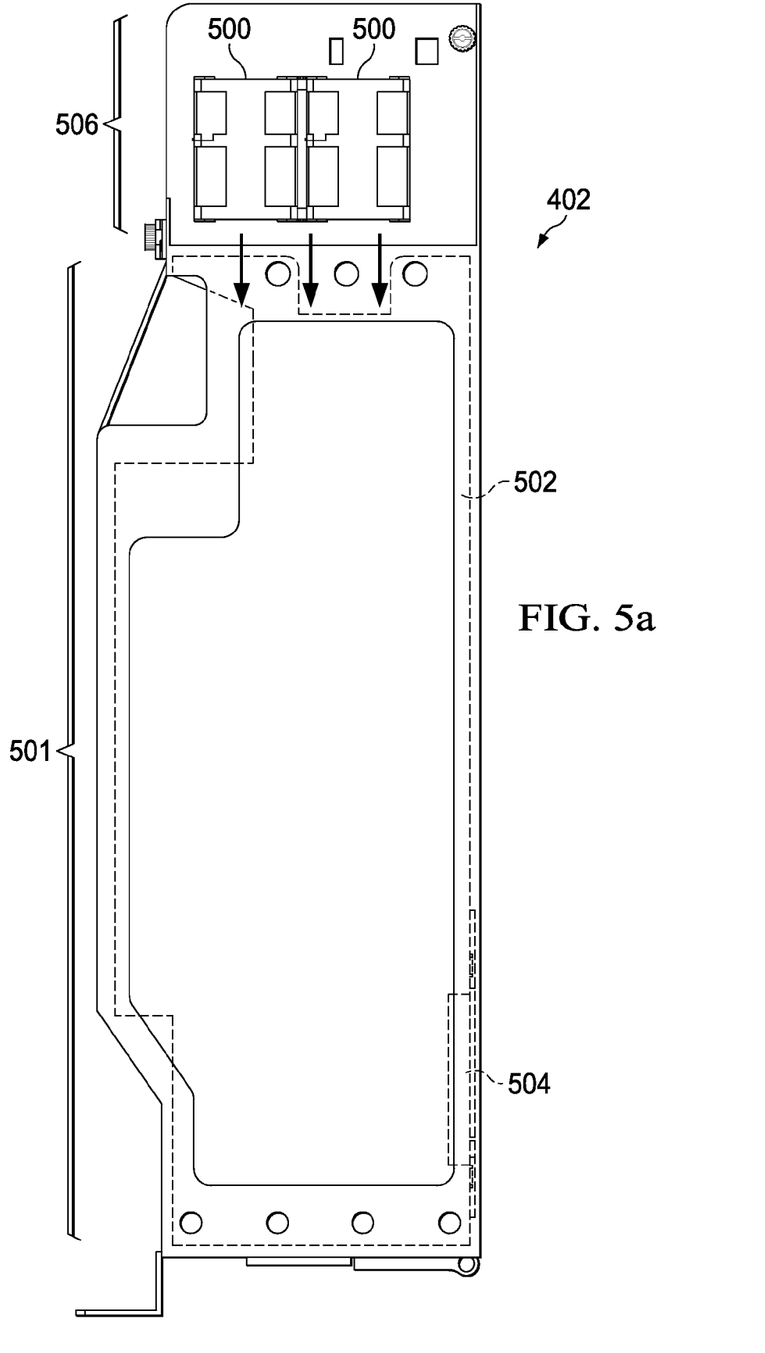
FIGS. 5a-5f show various views of an elevated graphics sub-chassis housed within the node of FIG. 4, in accordance with embodiments.

FIG. 5a shows a top-down view of the elevated graphics sub-chassis (hereinafter "sub-chassis") 402. The sub-chassis 402 comprises an enclosure 501 that houses a processor 502 (e.g., a graphics processor) which, in turn, couples to a riser card 504. The riser card 504 couples to the main board 400 (shown in FIG. 4) and facilitates the transfer of electrical signals between the processor 502 and the main board 400. The enclosure 501 may house, and the riser card 504 may couple to, any number of processor cards or other types of printed circuit boards. In at least some embodiments, other types of cards are used in lieu of or in combination with one or more processor cards.

An extension 506 couples to the enclosure 501. The extension 506 is parallel to at least one surface of the enclosure 501. The extension 506 generally comprises an unenclosed sheet of metal, plastic or other suitable material that acts as a platform upon which sub-chassis fans 500 are disposed. The sub-chassis fans 500 are disposed anterior to (or "in front of") contents of the enclosure 501 and superior to the main board 400. The enclosure 501 contains an orifice (shown in FIG. 5e) that faces the sub-chassis fans 500 so that the sub-chassis fans 500 may propel air through the orifice and into the enclosure 501. In some embodiments, multiple (e.g., two) sub-chassis fans 500 are disposed on the extension 506. In some embodiments, the sub-chassis fans 500 are smaller in size than the chassis fans 302. In some embodiments, at least one sub-chassis fan 500 has a height that is within 1 centimeter of a height of the enclosure 501. In some embodiments, at least one sub-chassis fan 500 has a width that is within 1 centimeter of a width of the enclosure 501. In some embodiments, cooling apparatuses other than fans are used in lieu of sub-chassis fans 500.

Figure 5B:
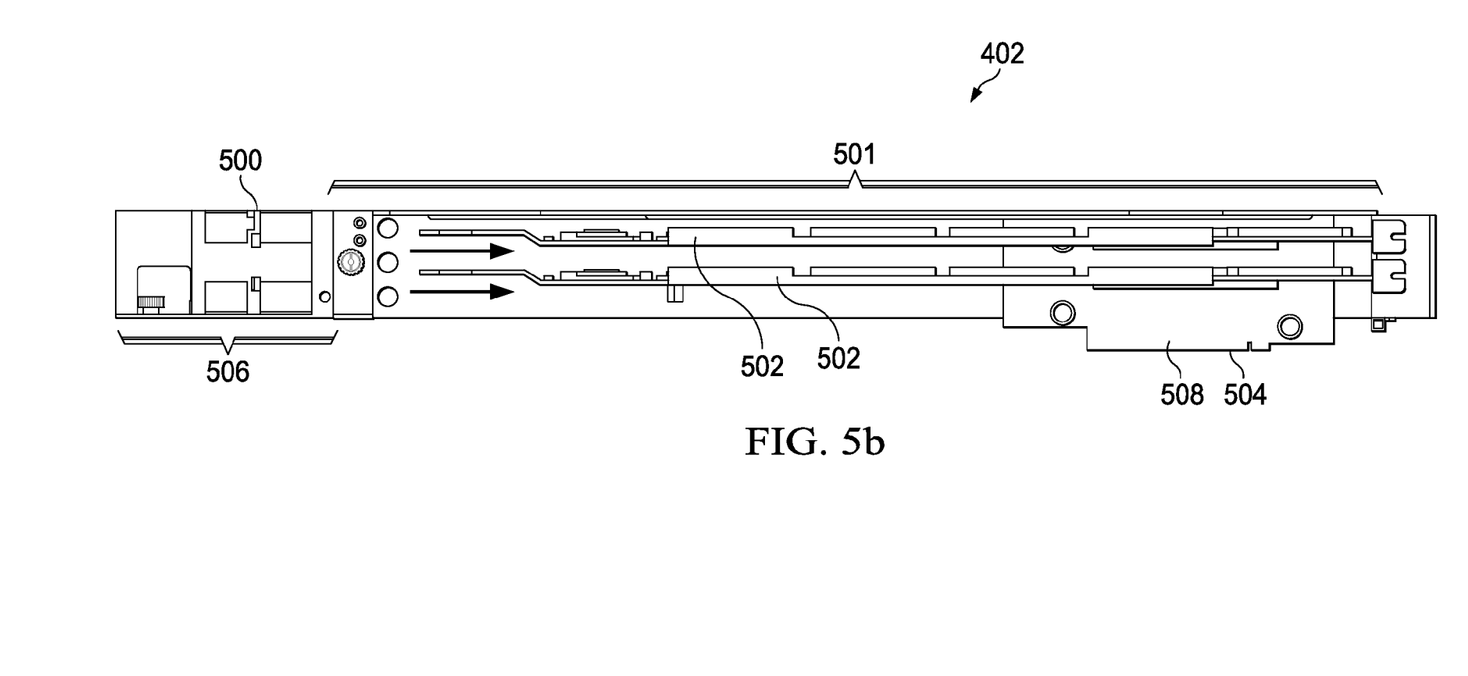

FIG. 5b shows a profile view of the sub-chassis 402. As explained above, the sub-chassis 402 comprises an enclosure 501 and an extension 506 that couples to the enclosure 501. The enclosure 501 comprises multiple (e.g., two) processors 502. The processors 502 couple to the riser card 504. The riser card 504 comprises a connector 508 that mates to the main board 400, thereby enabling the riser card 504 to transfer electrical signals between each of the processors 502 and the main board 400. Sub-chassis fans 500 are disposed on the extension 506 and, as shown, ventilate the contents of the enclosure 501, including the processors 502.

Figure 5C:
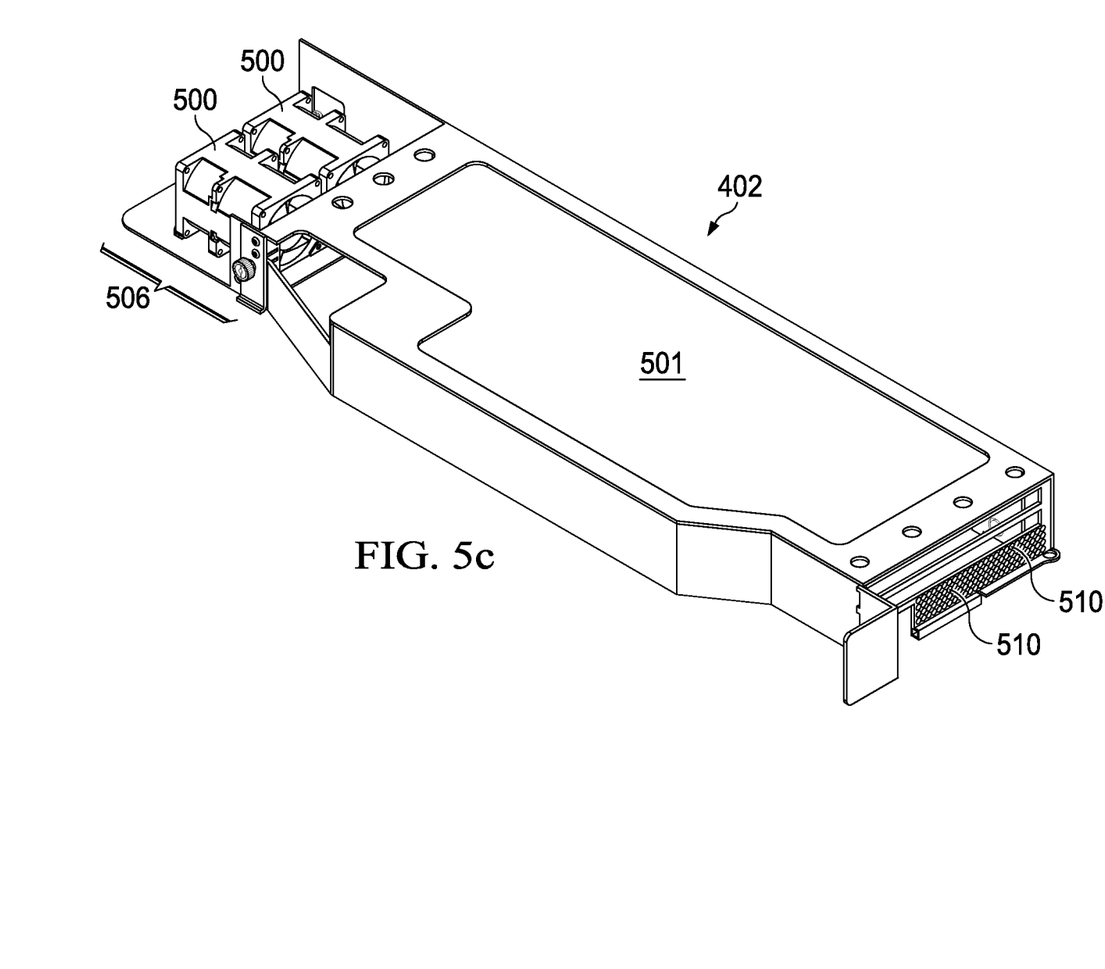

FIG. 5c shows a perspective view of the sub-chassis 402. Shown are the enclosure 501, the extension 506 and multiple sub-chassis fans 500 disposed on the extension 501 so that the fans 500 may propagate air through the enclosure 501, thereby cooling the contents of the enclosure 501. The sub-chassis 402 also comprises vents 510 that permit air to exit the enclosure 501.

Figure 5D:
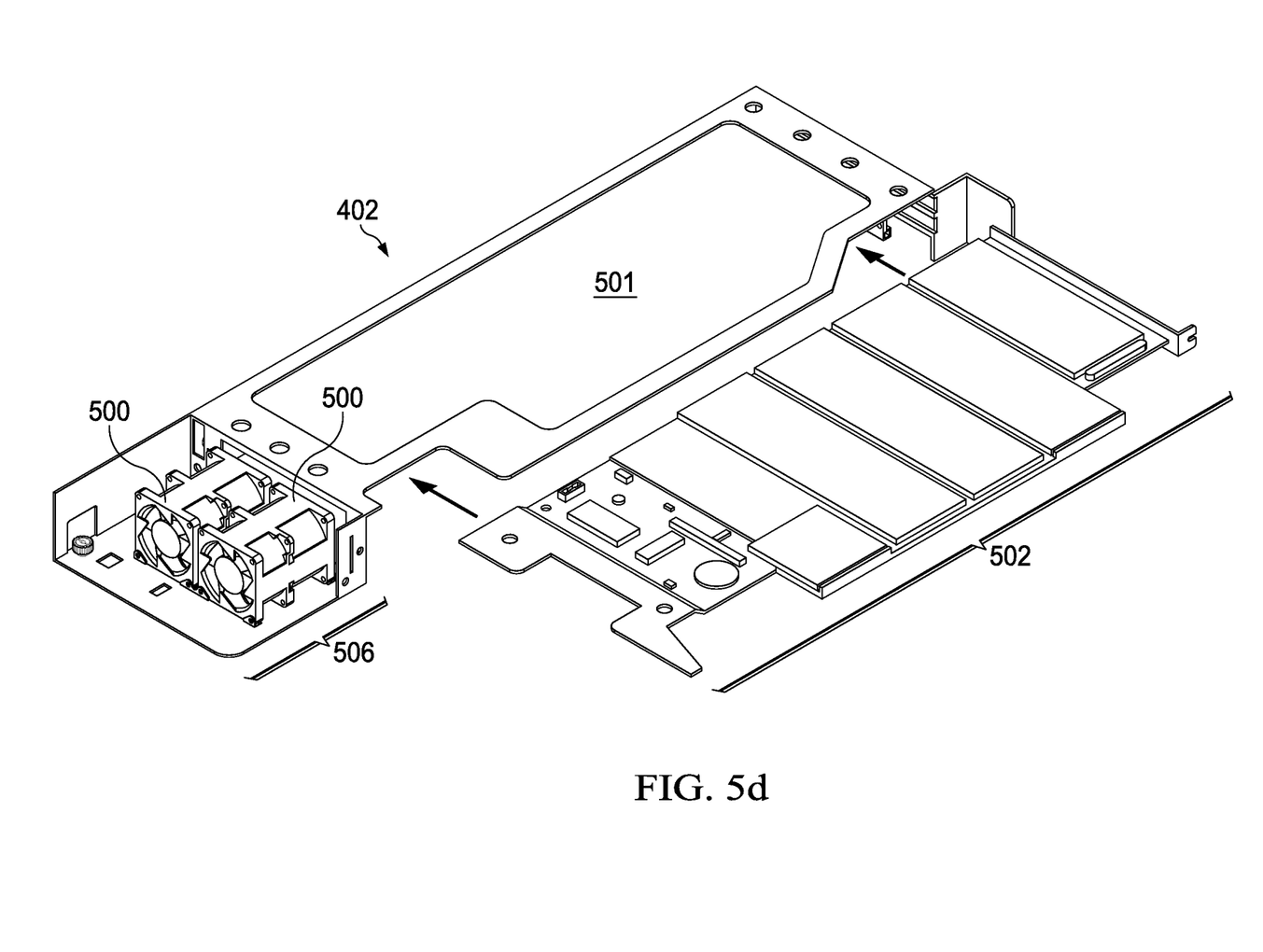

FIG. 5d shows another perspective view of the sub-chassis 402. In FIG. 5d, the sub-chassis 402 is partially dismantled to demonstrate how a processor 502 may be inserted into or removed from the enclosure 501. Specifically, the processor 502 may be inserted into the enclosure 501 so that it mates (in some embodiments, blind mates) with the riser card 504 (shown in FIGS. 5a, 5b and 5f). Additional cards (e.g., processor cards) may be similarly inserted into or removed from the enclosure 501.

Figure 5E:
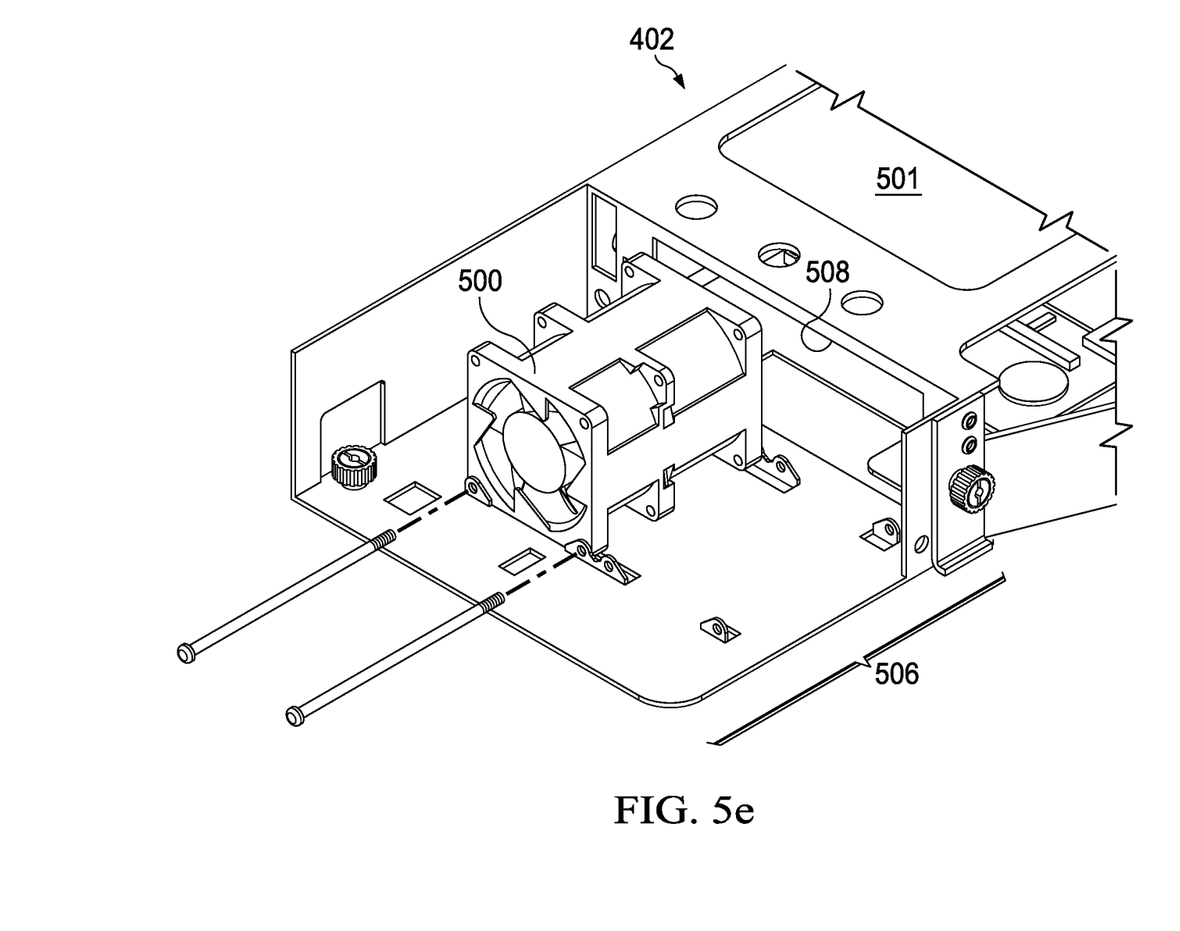
Figure 5F:
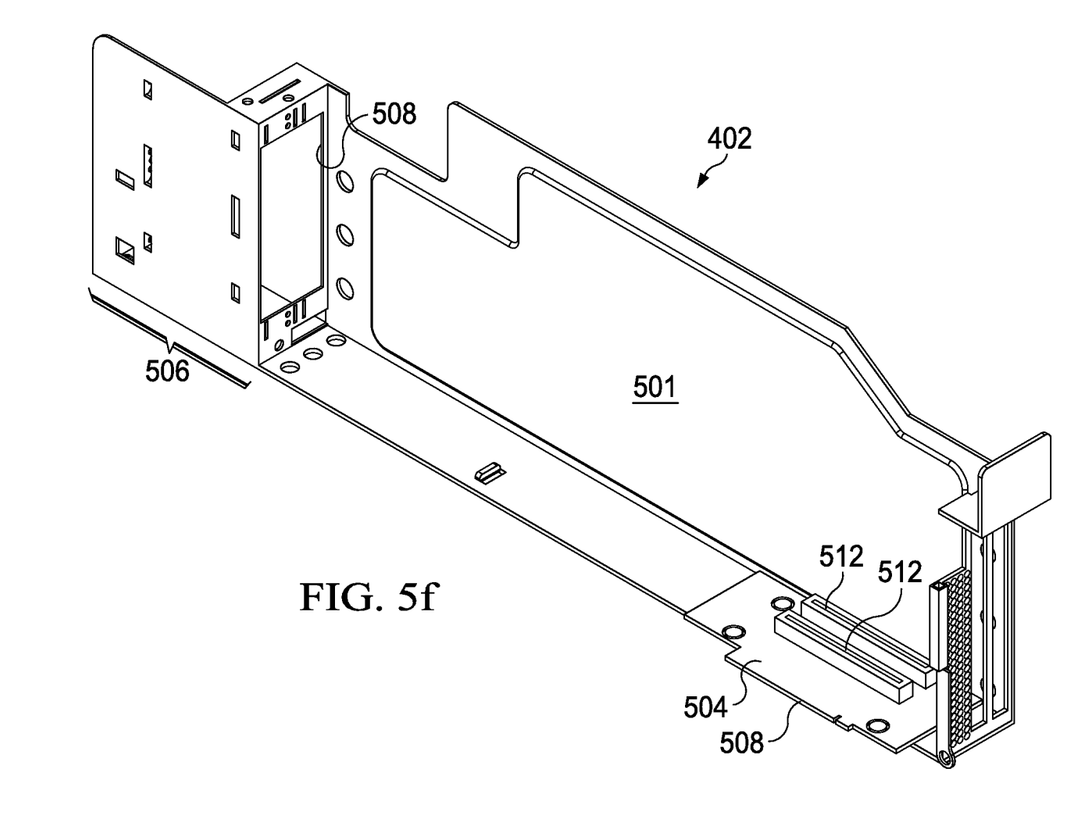

FIG. 5e shows a perspective, close-up view of the extension 506 and a sub-chassis fan 500. As shown, the enclosure 501 comprises an orifice 508 through which the sub-chassis fan 500 may propel air to cool the contents of the enclosure 501. FIG. 5f shows a perspective view of the partially dismantled sub-chassis 402. Shown are the riser card 504, the connector 508, the extension 506 and the orifice 508. Cards may couple to the riser card 504 by mating to connectors 512.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A chassis, comprising: a printed circuit board (PCB); and a sub-chassis housing multiple processors that couple to the PCB, said sub-chassis is disposed above and parallel to said PCB; wherein said multiple processors are cooled by a sub-chassis fan disposed on an extension that connects to an enclosure of said sub-chassis that houses said multiple processors, the enclosure comprising a pair of side members, front and back members, and a top member; and wherein the extension is formed outside of the side members, the front and back members, and the top member of the enclosure, and wherein the extension has a first major surface which abuts the bottom of the sub-chassis fan, wherein the first major surface of the extension is in a plane that is substantially parallel to, and faces the top member of, the enclosure.

2. The chassis of claim 1, wherein the chassis comprises a 2U server chassis.

3. The chassis of claim 1, wherein said multiple processors are cooled by a chassis fan, at least part of said chassis fan is disposed below said sub-chassis.

4. The chassis of claim 3, wherein said chassis fan is disposed anterior to said sub-chassis and said sub-chassis fan is disposed anterior to said multiple processors.

5. The chassis of claim 1, wherein a riser card is disposed between said sub-chassis and the PCB.

6. A system chassis, comprising:
a chassis fan; and a server node disposed posterior to said chassis fan and capable of being cooled by said chassis fan, the server node comprising:
  a printed circuit board (PCB);
  a sub-chassis, disposed above and parallel to said PCB, comprising an enclosure housing processors that couple to said PCB, the enclosure comprising a pair of side members, front and back members, and a top member; and
  sub-chassis fans disposed on an extension that connects to the enclosure of said sub-chassis, anterior to said processors and above said PCB, said sub-chassis fans adapted to cool said processors;
wherein the extension is horizontally formed outside of the side members, the front and back members, and the to member of the enclosure;
wherein the sub-chassis fans propel air through an orifice and into said enclosure; and
wherein the chassis comprises a 2U server chassis.

7. The system chassis of claim 6, wherein the system chassis comprises multiple instances of said node.

8. The system chassis of claim 6, wherein said extension is parallel to at least one surface of the enclosure.

9. The system chassis of claim 6, wherein said sub-chassis fans are disposed superior to said chassis fan.

10. The system chassis of claim 6, wherein a height of at least one of said sub-chassis fans is within 1 centimeter of a height of said sub-chassis.

11. The system chassis of claim 6, wherein a riser card is disposed between said sub-chassis and said PCB.

12. An apparatus, comprising:
  an enclosure that houses multiple processors, the enclosure comprising a pair of side members, front and back members, and a top member;
  means for coupling a printed circuit board (PCB) to said processors;
  a horizontal extension that protrudes outwardly away from said enclosure, wherein the extension is formed outside of the side members, the front and back members, and the to a member; and
  means for cooling said multiple processors, the means for cooling mounted on said extension entirely outside of the enclosure and propagating airflow into said enclosure via an orifice;
wherein the enclosure is disposed superior to said PCB.

13. The apparatus of claim 12, wherein said means for cooling has a height that is within 1 centimeter of a height of said enclosure and wherein said means for cooling has a width that is within 1 centimeter of a width of said enclosure.

14. The apparatus of claim 12, wherein said extension is parallel to at least one surface of said enclosure.

* * * * *

UNITED STATES PATENT AND TRADEMARK OFFICE
CERTIFICATE OF CORRECTION

PATENT NO. : 8,526,177 B2
APPLICATION NO. : 12/773629
DATED : September 3, 2013
INVENTOR(S) : David M. Paquin et al.

Page 1 of 1

It is certified that error appears in the above-identified patent and that said Letters Patent is hereby corrected as shown below:

In the Claims

In column 5, line 15, in Claim 6, delete "to" and insert -- top --, therefor.

In column 6, line 14, in Claim 12, delete "to a" and insert -- top --, therefor.

Signed and Sealed this
Fourth Day of February, 2014

Michelle K. Lee
*Deputy Director of the United States Patent and Trademark Office*